United States Patent
Mallikarjunaswamy

(10) Patent No.: US 6,696,731 B2
(45) Date of Patent: Feb. 24, 2004

(54) ESD PROTECTION DEVICE FOR ENHANCING RELIABILITY AND FOR PROVIDING CONTROL OF ESD TRIGGER VOLTAGE

(75) Inventor: Shekar Mallikarjunaswamy, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/206,282

(22) Filed: Jul. 26, 2002

(65) Prior Publication Data

US 2004/0016992 A1 Jan. 29, 2004

(51) Int. Cl.$^7$ .............................................. H01L 23/62
(52) U.S. Cl. ...................... 257/362; 257/361
(58) Field of Search .................. 257/362, 361

(56) References Cited

U.S. PATENT DOCUMENTS

| | | | | |
|---|---|---|---|---|
| 4,763,184 A | * | 8/1988 | Krieger et al. | 257/362 |
| 5,455,436 A | * | 10/1995 | Cheng | 257/356 |
| 5,808,342 A | * | 9/1998 | Chen et al. | 257/357 |
| 6,194,764 B1 | * | 2/2001 | Gossner et al. | 257/355 |

OTHER PUBLICATIONS

Chirstian C. Russ et al., "GGSCRs: GGNMOS Triggered Silicon Controlled Rectifiers for ESD Protection in Deep Sub–Micron CMOS Processes", proceedings of the EOS/ESD Symposium, 2001, pp. 22–31.

* cited by examiner

*Primary Examiner*—Jerome Jackson
(74) *Attorney, Agent, or Firm*—Patent Law Group LLP; Carmen C. Cook

(57) ABSTRACT

A diode-triggered NPN ESD protection device includes a P-Base enclosing the emitter region of the NPN transistor for enhancing the reliability of the ESD protection device. The incorporation of the P-Base region encourages bulk transistor action and inhibits surface transistor action such that the reliability of the protection device is enhanced. In another aspect of the present invention, a trigger voltage control method is applied to a diode-triggered ESD protection device to extend the periphery length of the p-n junction of the trigger diode without increasing the size of the protection device. By extending the periphery length of the p-n junction, the trigger current generated by the trigger diode is increased so that the trigger voltage for the ESD protection device can be lowered, providing effective ESD protection. The periphery length is extended by using a shaped periphery, such as a corrugated periphery or a perforated periphery.

18 Claims, 6 Drawing Sheets

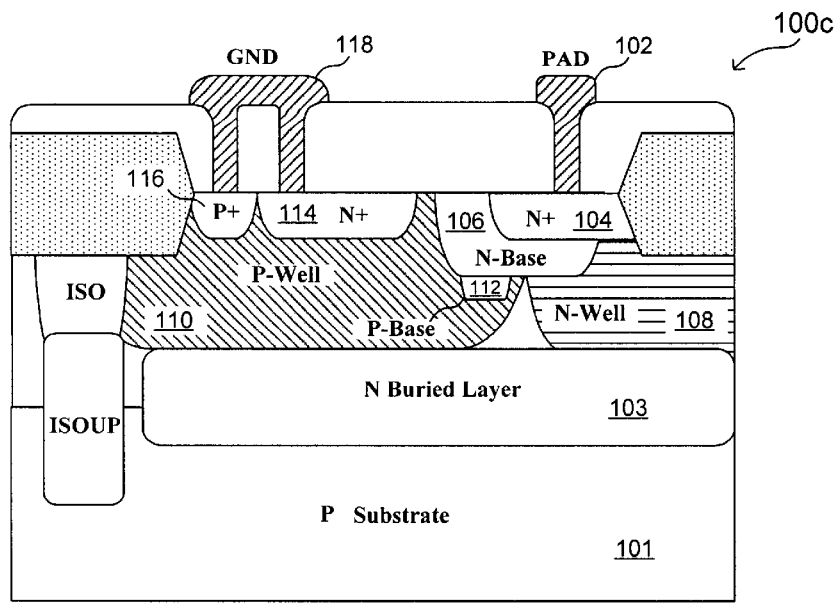
*Figure 7*
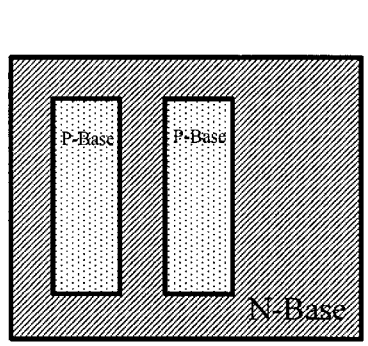 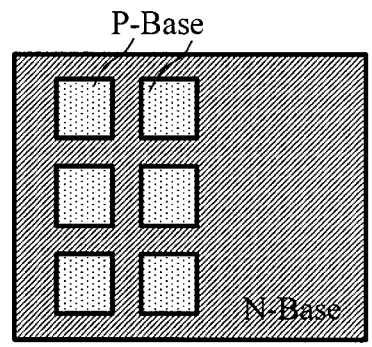
*Figure 8a*  *Figure 8b*

ESD PROTECTION DEVICE FOR ENHANCING RELIABILITY AND FOR PROVIDING CONTROL OF ESD TRIGGER VOLTAGE

FIELD OF THE INVENTION

The invention relates to a structure and a method for protecting an integrated circuit against internal circuit damages caused by electrostatic discharge (ESD) and, in particular, to a structure and method for controlling the trigger voltage of the ESD protection devices.

DESCRIPTION OF THE RELATED ART

Electrostatic discharge (ESD) is a well-known concern when designing an integrated circuit (IC). ESD events can occur at the input/output pads of an IC or the power supply pins. The ESD spikes can reach up to several thousand volts and can destroy circuitry within an IC, such as field effect transistors (FETs). Accordingly, integrated circuits frequently include some kind of protection circuit for preventing high voltage ESD spikes applied to input/output pads from reaching internal circuitry and causing permanent damages.

Conventional ESD protection devices rely on one or more p-n junction diodes to trigger an associated parasitic bipolar transistor connected to the input/output pad to shunt the ESD spikes to either the supply voltage Vdd pin or the ground pin. FIG. 1 is a cross-sectional view of a conventional ESD protection device 10 connected to a pad of an integrated circuit. Referring to FIG. 1, an input pad 12, besides being connected to the intended internal circuit element (not shown), is connected to an n+ diffusion 14 forming the cathode of a protection diode. A P-well 16 forms the anode of the protection diode and is connected to the ground voltage through p+ diffusion 18. A parasitic bipolar transistor, including n+ collector 14, p-base 16 and n+ emitter 19, is also formed between pad 12 and the ground voltage. ESD protection is afforded by the junction breakdown of the diode (n+ diffusion 14 and P-well 16) and the bipolar transistor action.

The voltage at which an ESD protection device is activated is referred to as the trigger voltage. In the ESD protection device of FIG. 1, the trigger voltage is determined by the reverse-biased breakdown voltage of the n+ (14) to P-well (16) junction and the inherent parasitic resistance of the p-n junction. To provide effective ESD protection, the protection device must be triggered before the ESD voltage reaches the protected device, causing the protected device to break down and self-destruct.

As technology is scaled for smaller feature sizes, the breakdown voltage of semiconductor devices decreases. The smaller breakdown voltage reduces the voltage margin between the breakdown voltage of semiconductor devices to be protected and the trigger voltage of the ESD protection devices. Due to the inherent parasitic resistance of the ESD protection device, the trigger voltage can actually exceed the breakdown voltage of the protected device, rendering the ESD protection device useless. Prior art techniques for reducing the parasitic resistance, and thereby the trigger voltage, of the ESD protection device are unsatisfactory because these techniques generally involve increasing the layout area of the protection device.

Therefore, it is desirable to provide effective ESD protection as technology scales down without increasing the size of the ESD protection device.

SUMMARY OF THE INVENTION

According to one embodiment of the present invention, a semiconductor device formed in a semiconductor substrate for protecting against electrostatic discharge includes a first region of a first conductivity type and having a first dopant concentration. The first region is coupled to an input pad of an integrated circuit. The semiconductor device further includes a first well of a second conductivity type where the first well extending partially under the first region, a second region of the second conductivity type formed in the first well and having a dopant concentration greater than a dopant concentration of the first well, and a third region of the first conductivity type formed in the second region and being connected to a reference voltage. The third region has a dopant concentration greater than the dopant concentration of the second region. Finally, the semiconductor device includes a fourth region of the second conductivity type formed in the second region and being connected to the reference voltage. The fourth region has a dopant concentration greater than the dopant concentration of the second region.

In the semiconductor device, the first region and the first well forms the p-n junction of a trigger diode, and the first region forms a collector region, the first well and the second region form a base and the third region forms an emitter region of an NPN transistor. The incorporation of the second region encourages bulk transistor action and inhibits surface transistor action such that the reliability of the semiconductor device is enhanced.

According to another aspect of the present invention, a diode-triggered bipolar transistor ESD protection device includes a diode having a junction of a p-type semiconductor material and an n-type semiconductor material where the junction of the diode has a shaped periphery. The anode of the diode is coupled to a reference voltage and the cathode of the diode is coupled to a pad of an integrated circuit. The ESD protection device also includes a transistor having a first current handling terminal coupled to the pad, a second current handling terminal coupled to the reference voltage, and a control terminal coupled to the anode of the diode. In operation, the diode provides reverse-biased breakdown current to the transistor when a voltage at the pad exceeds a breakdown voltage of the diode.

The shaped periphery of the junction can include a corrugated boundary, a perforated boundary and other shapes for extending the length of the junction periphery.

In other embodiments, the ESD protection device can be a diode-triggered SCR type ESD protection device, such as an N+/P-Well triggered SCR type ESD protection device or an LVTSCR type ESD protection device.

The present invention is better understood upon consideration of the detailed description below and the accompanying drawings.

BRIEF DESCRIPTION OF THE DRAWINGS

FIG. 3 is the equivalent circuit of ESD protection device of FIG. 2a.

FIGS. 6a and 6b illustrate two embodiments of the present invention where the trigger voltage control method is applied to increase the periphery length of the junction of the trigger diode in the ESD protection device of FIG. 2a.

FIG. 7 is a cross-sectional view of a diode-triggered NPN ESD protection device according to an alternate embodiment of the present invention.

FIGS. 8a and 8b illustrate two embodiments of the present invention where the trigger voltage control method is applied to increase the periphery length of the junction of the buried trigger diode in the ESD protection device of FIG. 7.

DETAILED DESCRIPTION OF THE PREFERRED EMBODIMENTS

According to one aspect of the present invention, a diode-triggered NPN ESD protection device includes a P-Base region enclosing the emitter region of the NPN transistor for enhancing the reliability of the ESD protection device. According to another aspect of the present invention, a trigger voltage control method is applied to a diode-triggered ESD protection device to extend the periphery length of the p-n junction of the trigger diode without increasing the size of the protection device. By extending the periphery length of the p-n junction, the trigger current generated by the trigger diode is increased so that the trigger voltage for the ESD protection device can be lowered and the protection device can be turned on faster to provide effective ESD protection.

Figure 2A:
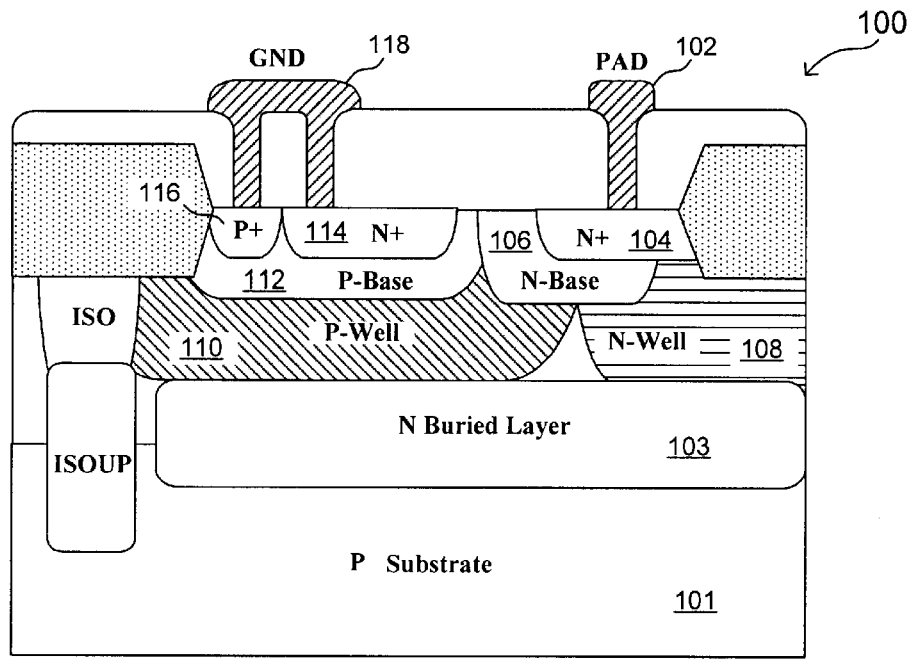
FIG. 2a is a cross-sectional view of a diode-triggered NPN ESD protection device according to one embodiment of the present invention.
Figure 2B:
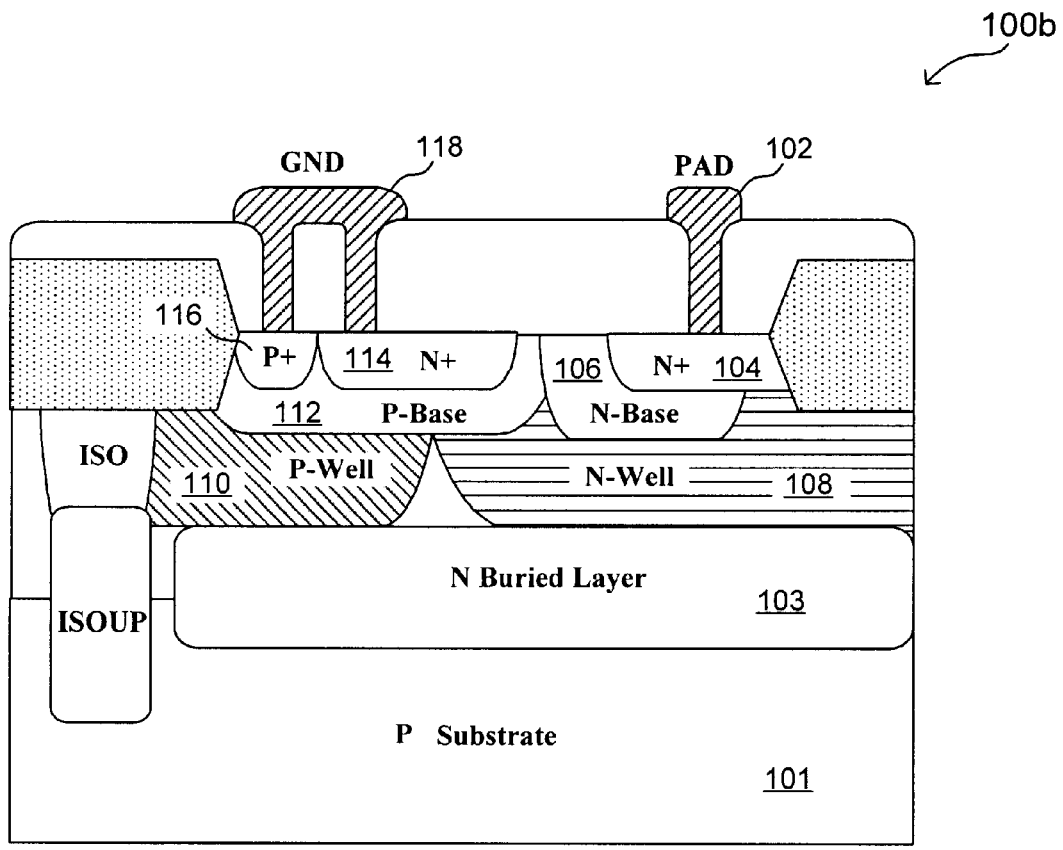
FIG. 2b is a cross-sectional view of a diode-triggered NPN ESD protection device according to an alternate embodiment of the present invention.
Figure 3:
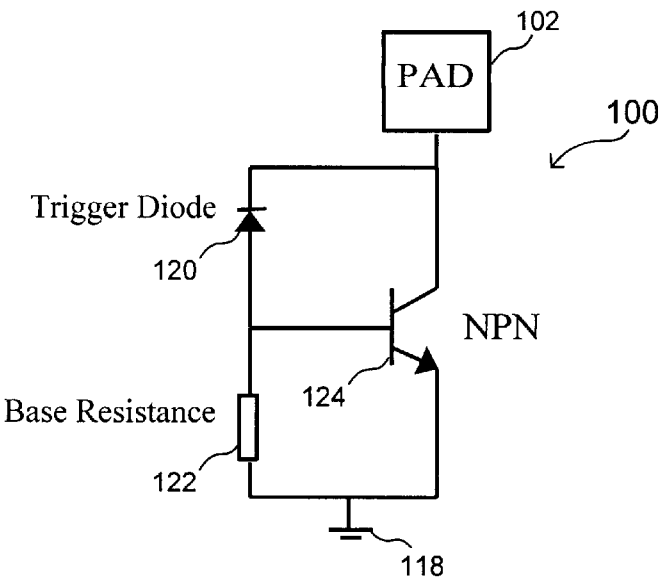

FIG. 2a is a cross-sectional view of a diode-triggered NPN ESD protection device according to one embodiment of the present invention. The equivalent circuit of ESD protection device is shown in FIG. 3. Referring to FIGS. 2 and 3, ESD protection device 100 includes a trigger diode 120 and an NPN transistor 124, both connected between an input pad 102, which may be subjected to an ESD spike, and a ground node 118. Referring to the cross-sectional view in FIG. 2a, the p-n junction of trigger diode 120 is formed by an N-type diffusion region (N-Base) 106 to a P-type diffusion region (P-Base) 112 and a P-Well 110. Input pad 102 is connected to the cathode of diode 120 though an n+ diffusion region 104. The anode of diode 120 is connected to the ground node 118 through a p+ diffusion region 116.

NPN transistor 124 of ESD protection device 100 includes a collector terminal formed by N-base 106 and a base terminal formed by P-well 110 and P-Base 112. The emitter terminal is formed by an n+ diffusion region 114 which is connected to ground node 118. The inherent N+ pinched base resistance of P-well 110 and P-Base 112 is represented by a base resistance element 122 in FIG. 3. In addition to base resistance 122, trigger diode 120 also has a series parasitic resistance due to the inherent resistance of the N-Base and N+ contact.

The general operation of ESD protection device 100 is as follows. When the voltage at input pad 102 exceeds the reverse bias breakdown voltage of trigger diode 120, diode 120 enters either avalanche breakdown or Zener breakdown, and avalanche/Zener currents flows under N+ emitter 114 of NPN transistor 124. The avalanche/Zener current forward biases the N+ emitter to P-base/P-well junction and NPN transistor 124 turns on. When NPN transistor 124 turns on, ESD protection device 100 enters "snap-back" where NPN transistor 124 conducts a large amount of current at a low collector-to-emitter voltage. In this manner, ESD protection device 100 provides input pad 102 with effective protection against ESD events by shunting the ESD spikes through NPN transistor 124 during snap-back. The voltage at which NPN snap-back is initiated is referred to as the trigger voltage. The trigger voltage is determined by the breakdown voltage of the trigger diode as well as the magnitude of the trigger current provided by the diode to turn-on the NPN transistor.

In accordance with the present invention, trigger diode 120 can be designed to enter Zener breakdown or avalanche breakdown when reversed biased. The selection of either the Zener breakdown mode or the avalanche breakdown mode is purely a matter of design choice and dependent upon the application in which the ESD protection circuit is to be used. The design factors to be considered include the magnitude of the desired trigger voltage and the desired temperature-dependant characteristics of the protection device. For example, while Zener breakdown occurs at relatively low voltages, such as around 6 volts, the Zener breakdown voltage is highly temperate dependent and decreases with temperature. Avalanche breakdown, on the other hand, occurs at a higher voltage but is more stable across a wide temperature range. One of ordinary skill in the art would appreciate that the doping levels of the p-n junction determines whether the junction enters Zener breakdown or avalanche breakdown in reverse bias. Thus, by selecting the appropriate doping levels for N-Base 106, P-Base 112 and P-Well 110, trigger diode 120 can be caused to enter either a Zener breakdown or an avalanche breakdown when reversed biased.

ESD protection device 100 of the present invention incorporates novel features for enhancing the performance of the ESD protection device.

First, ESD protection device 100 includes features for enhancing the reliability of the protection device. Specifically, ESD protection device 100 includes P-Base 112 defining an active area and enclosing the entire n+ emitter region (n+ diffusion region 114). In the present embodiment, ESD protection device 100 also includes N-Base 106 abutting the P-Base and also defining an active area. N-Base 106 is optional and may be omitted in other embodiments of the present invention. When N-Base 106 is omitted from ESD protection device 100, P-well 110 extends only partially under N+diffusion region 104 so as not to inhibit the vertical NPN transistor action and create an N+ to P-well avalanche trigger diode.

The function of P-Base 112 in ESD protection device 100 is to provide a higher doping in the bulk of the protection device such that surface NPN transistor action is inhibited and only bulk NPN transistor action takes place. Specifically, the P-base region inhibits surface leakage currents between the emitter (n+ region 114) and the collector (n+ region 104) of NPN transistor 124 after NPN snapback. By limiting the transistor action to the bulk, the reliability of the protection device is improved. In an alternate embodiment, the P-base can be implanted only on the periphery of the N+ emitter and extended over N+ emitter 114 to overlap it partially to increase the current gain of NPN transistor.

The function of N-Base 106 is to increase the breakdown voltage of trigger diode 120 so that ESD protection device 100 can be used to protect higher voltage devices. The breakdown voltage of a p-n junction diode is a function of the dopant concentration of the lightly doped side. For avalanche breakdown, the breakdown voltage decreases with increased dopant concentration. When N-Base is not present, the heavily doped n+ diffusion region 104 abuts P-Base and P-well directly and the breakdown voltage can be lower than desired. On the other hand, when N-base 106 is introduced in ESD protection device 100, the breakdown voltage is increased since the p-n junction now includes two relatively lightly doped regions. N-Base 106 is optional in ESD protection device 100 and may be omitted if adjustment of the breakdown voltage is not needed.

In the present embodiment, ESD protection device 100 is built on a P-type substrate 101 including an N-type buried layer 103. Furthermore, ESD protection device 100 includes a P-well 110 and an N-Well 108. N-Well 108 is optional and in other embodiments where an N-type epitaxy layer is used, the N-Well may be omitted. In one embodiment, the N-Well and P-Well each has a dopant concentration in the order of 5E12 per cm$^2$, the P-Base and N-Base each has a dopant concentration of 1E13 to 1E14 per cm$^2$, and n+ and p+ regions each has a dopant concentration of 5E15 per cm$^2$.

Figure 1:
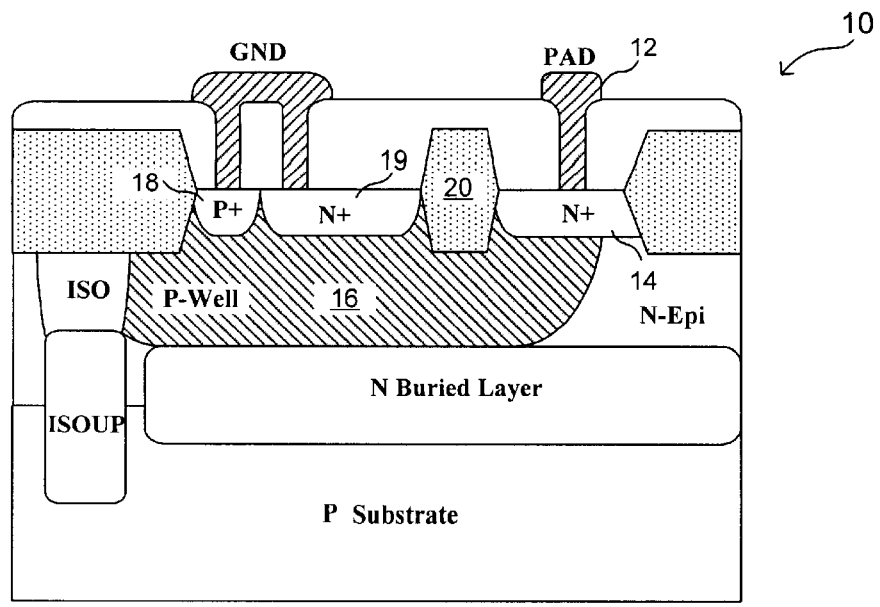
FIG. 1 is a cross-sectional view of a conventional ESD protection device connected to a pad of an integrated circuit.

Another feature of the ESD protection device of the present invention is the elimination of a field oxide layer in current path of the NPN transistor which has the effect of improving the reliability of the protection device. Referring to FIG. 2a, P-Base 112 and N-Base 106 define the active area for trigger diode 120 and NPN transistor 124 such that a field oxide layer is not used in the ESD protection device of the present invention. In conventional protection devices such as device 10 of FIG. 1, a field oxide layer is used to define the active areas in which N-type and P-type diffusions are placed. However, when an ESD protection device includes a field oxide layer in the current path of the NPN transistor, destructive snap-back usually results. That is, when the ESD event expires, the ESD protection device will end up with a higher leakage current (10–100 µA) than the leakage current prior to the ESD event (1µA). By using P-Base and N-Base to define the active area and eliminating the field oxide layer in ESD protection device 100, destructive snap-back is avoided and the reliability of ESD protection device 100 is improved. In addition, due to higher junction depth of the N-base layer, the current density in N-Base 106 is reduced which has the effect of improving the reliability of the ESD protection device. In an alternate embodiment, in order to further reduce the current density in N-Base 106, the P-well/N-well junction under N-base can be positioned to be under the P-base region, as shown in FIG. 2b.

In accordance with another aspect of the present invention, a method to control of the trigger voltage of an ESD protection device is described. More particularly, the method can be used to lower the trigger voltage of an ESD protection device so as to provide effective ESD protection for sub-micron semiconductor devices.

Figure 4:
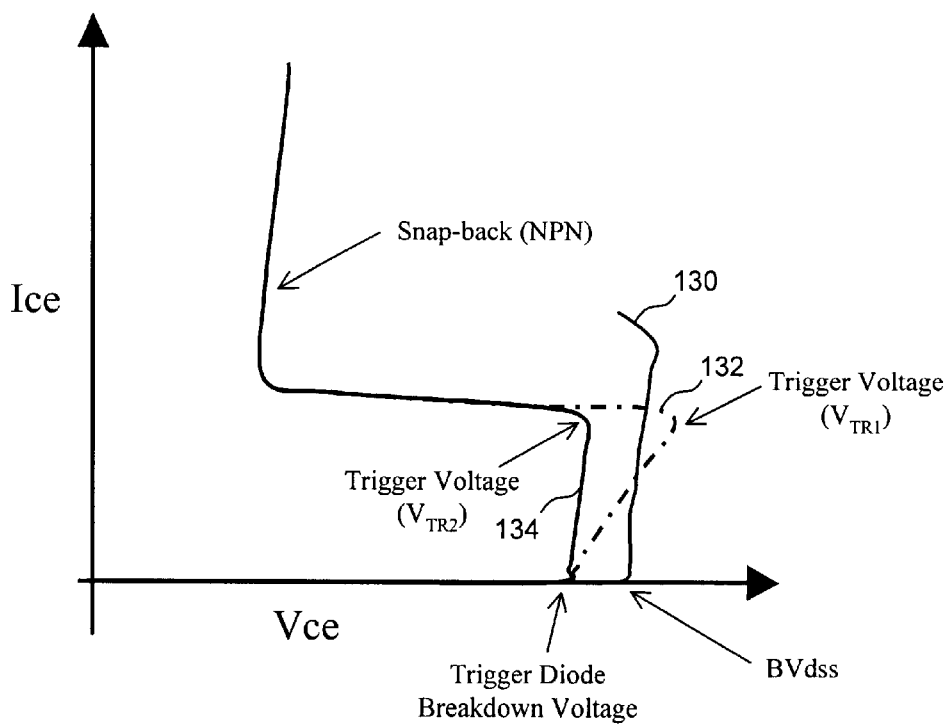
FIG. 4 is a plot illustrating the behavior of the current through the ESD protection circuit of FIG. 3 during an ESD event.

FIG. 4 is a plot illustrating the behavior of the current through the ESD protection circuit of FIG. 3 during an ESD event. Referring to FIGS. 3 and 4, curve 130 depicts the breakdown voltage (BVdss) of a semiconductor device (e.g., a transistor) connected to pad 102 and to be protected from ESD damages. To provide effective ESD protection, the trigger voltage of the ESD protection device must be lower than the breakdown voltage BVdss of the device to be protected.

Curve 132 depicts the behavior of the currents through a conventional ESD protection circuit. When an ESD event occurs at pad 102, the large voltage at pad 102 puts trigger diode 120 in reverse bias and eventually causes trigger diode 120 to enter breakdown. When sufficient Zener or avalanche current flows into the base terminal of transistor 124 and forward biases the base-emitter junction of the transistor, transistor 124 is turned on and NPN snap-back is initiated. The voltage at which snap-back occurs is the trigger voltage of the ESD protection device. The trigger voltage is a function of the amount of trigger current available to turn on NPN transistor 124. When the trigger current is limited, a large trigger voltage is required to drawn sufficient current to cause NPN transistor 124 to enter snap-back.

Referring to FIG. 4, the conventional ESD protection device has a trigger voltage $V_{TR1}$. While trigger voltage $V_{TR1}$ may be adequate for devices manufactured using technologies having larger dimensions and thus larger BVdss voltages, the trigger voltage $V_{TR1}$ becomes too large for devices manufactured using newer scaled-down technologies. As shown in FIG. 4, the trigger voltage of the conventional ESD protection device is greater than the BVdss voltage of the devices to be protected, rendering the protection device useless. Conventional methods for increasing the trigger current of an ESD protection device include increasing the size of the ESD protection device. However, because ESD protection devices are inherently large in size already, further increase in size of the protection device is not desirable and may be infeasible in some applications. In fact, as technology scales down, it is desirable that the ESD protection structure can be made smaller accordingly.

In accordance with the present invention, the trigger voltage control method operates to lower the trigger voltage of an ESD protection device by increasing the amount of trigger current without increasing the size of the ESD protection device. Specifically, because the magnitude of the avalanche or Zener breakdown current is proportional to the periphery of the p-n junction of the trigger diode, the trigger current can be increased by increasing the length of the periphery of the diode junction without increasing the overall dimension of the trigger diode. The trigger voltage control method of the present invention will first be described with respect to the ESD protection device of FIG. 2a. However, as will be apparent in the discussion below, the trigger voltage control method of the present invention can be applied to other ESD protection devices as well.

Figure 5:
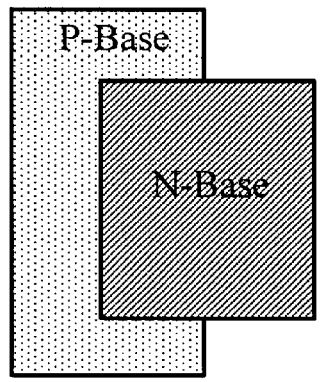
FIG. 5 is a top view of a conventional layout of a p-n junction in an ESD protection device.

Referring to FIG. 2a, trigger diode 120 of ESD protection device 100 is formed by the p-n junction of N-Base 106 and P-Base 112. When trigger diode 120 is designed in accordance with the conventional layout methodology, the periphery of the junction is generally drawn in a straight line, as depicted by the top view of the layout of the P-Base and the N-Base shown in FIG. 5. The magnitude of the trigger current in the conventional design is thus limited by the length of the periphery of the p-n junction.

Figure 6A:
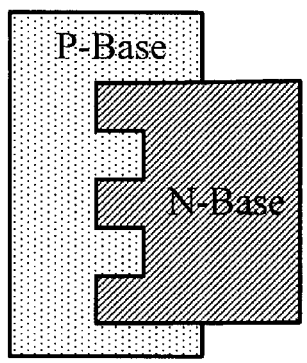
Figure 6B:
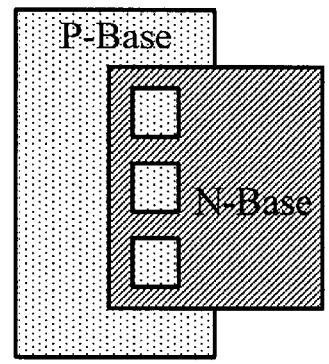

However, in accordance with the trigger voltage control method of the present invention, the periphery of the p-n junction of the trigger diode is drawn in a manner so as to extend the length of the junction without increasing the layout area of the diode. FIGS. 6a and 6b illustrate two embodiments of the present invention where the trigger voltage control method is applied to increase the periphery length of the junction of the trigger diode in ESD protection device 100. In FIG. 6a, the periphery of the N-base is corrugated such that an almost two times increase in periphery length is realized. In FIG. 6b, the N-Base is perforated with one or more openings so that the periphery of the p-n junction includes not only the outer perimeter of the N-Base layout but also includes the inner perimeter of the openings. The layout design of the N-Base/P-Base junction in FIG. 6b can result in more than two times increase in the periphery length of the junction of the trigger diode.

As a result of the increased periphery length, the magnitude of the avalanche/Zener breakdown current is correspondingly increased. Thus, ESD protection device 100 incorporating the extended periphery length feature of the present invention can operate at a trigger voltage, making it suitable for use in integrated circuits manufactured using advanced sub-micron technology. More importantly, the increase in junction periphery length is realized without any increase in the area of the trigger diode. Thus, the overall dimension of ESD protection device 100 can remain the same while the trigger voltage is lowered to the desired value. Curve 134 in FIG. 4 depicts the behavior of the current through ESD protection device 100 after application of the trigger voltage control method of the present invention. By increasing the length of the junction periphery and thereby the breakdown current of the trigger diode, the triggering of the NPN snap-back can occur sooner and at a lower trigger voltage ($V_{TR2}$). In this manner, the trigger voltage $V_{TR2}$ of ESD protection device 100 can be made to be less than the breakdown voltage (BVdss) of the devices to be protected, as shown in FIG. 4.

In cases where the trigger voltage of the trigger diode is determined by N+ diffusion to P-Base or N-Base to P-Base surface, methods for increasing the avalanche/zener junction breakdown voltage can be applied. Thus, in an alternate embodiment of the present invention, a buried trigger diode is created where the P-Base diffusion is buried under the N+ region or the N-Base as shown in FIG. 7. In yet another embodiment, the breakdown voltage of the buried trigger diode can be further increased by forming an elongated P-base diffusion region as shown in FIG. 8a or by patterning the P-base diffusion into slots as shown in FIG. 8b. Furthermore, to increase the avalanche/zener breakdown current (the trigger current) of the buried trigger diode, the periphery of the p-n junction of the trigger diode can be increased by providing multiple elongated P-Base regions (FIG. 8a) or by patterning the P-Base region into multiple slots (FIG. 8b).

Figure 9:
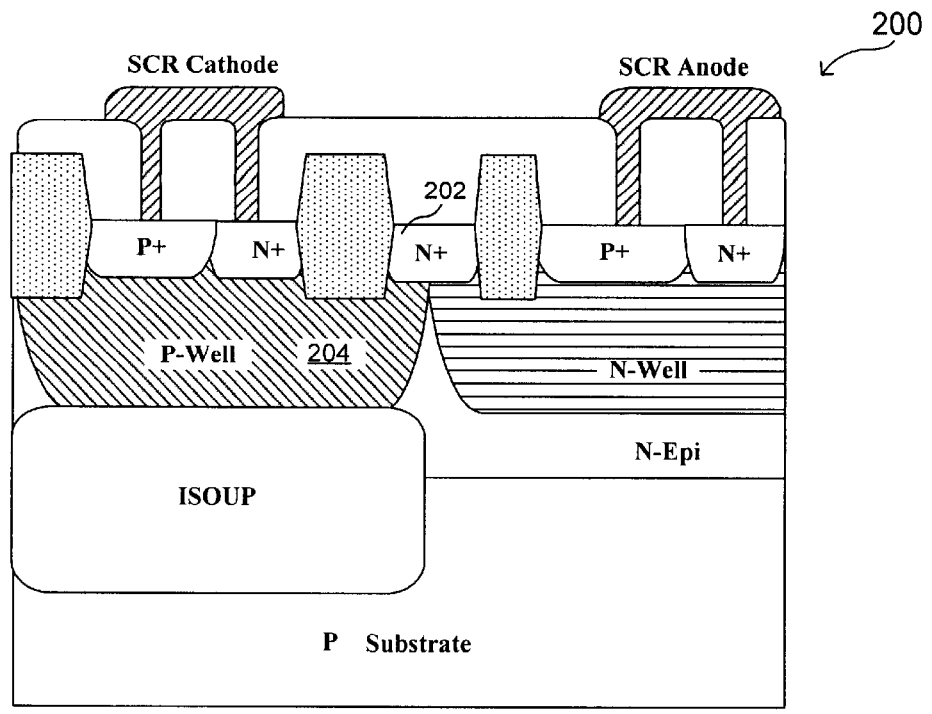
FIG. 9 illustrates an N+ to P-well triggered silicon controlled rectifier (SCR) type ESD protection device in which the trigger voltage control method of the present invention can be applied.
Figure 10:
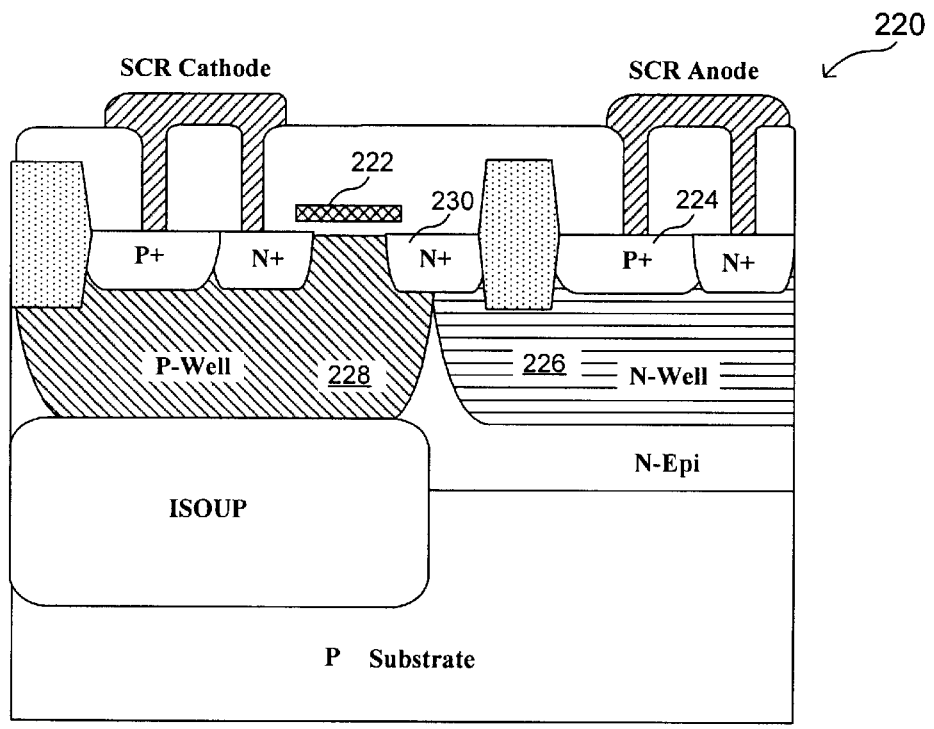
FIG. 10 illustrates a Low Voltage Triggering SCR (LVTSCR) type ESD protection device in which the trigger voltage control method of the present invention can be applied.

The trigger voltage control method of the present invention has particular usage in ESD protection devices for advanced sub-micron technologies where the margin between breakdown voltage of the protected devices and the trigger voltage of the ESD protection devices reduces. The trigger voltage control method of the present invention can be applied to other types of ESD protection device for increasing the trigger current of the protection device so as to lower the trigger voltage. In particular, the trigger voltage control method of the present invention is applicable whenever the ESD protection device uses a p-n junction for triggering protection operation. FIGS. 9 and 10 illustrate two exemplary ESD protection devices where the trigger voltage control method of the present invention can be advantageously applied.

FIG. 9 illustrates an N+ to P-well triggered silicon controlled rectifier (SCR) type ESD protection device in which the trigger voltage control method of the present invention can be applied. The SCR of ESD protection device 200 is turned on to shunt the ESD energy when the junction between N+ diffusion 202 and P-Well 204 breakdowns. The anode of the SCR (which is the cathode of the trigger diode) is coupled to the input/output pad of an integrated circuit while the cathode of the SCR (which is the anode of the trigger diode) is coupled to a reference voltage (such as ground). When the trigger voltage control method of the present invention is applied to ESD protection device 200, the periphery of N+ diffusion region 202 is drawn in a corrugated shape as shown in FIG. 6a to increase the length of the junction periphery. In this manner, the trigger current generated by the junction to trigger SCR action is increased without any increase in the size of the protection device.

FIG. 10 illustrates a Low Voltage Triggering SCR (LVTSCR) type ESD protection device in which the trigger voltage control method of the present invention can be applied. Referring to FIG. 10, LVTSCR ESD protection device 220 relies on the breakdown of the N+ drain 230 to P-well 228 junction of MOSFET transistor 222. The breakdown current of MOSFET transistor 222 provides the base current for turning on the PNP transistor consisting of P+ diffusion region 224, N-Well 226 and P-Well 228, thereby triggering the SCR action. The anode of the SCR (which is the cathode of the trigger diode) is coupled to the input/output pad of an integrated circuit while the cathode of the SCR (which is the anode of the trigger diode) is coupled to a reference voltage (such as ground). When the trigger voltage control method of the present invention is applied to ESD protection device 220, the periphery of N+ diffusion region 230 forming the drain of MOSFET transistor 222 can be drawn in a corrugated shaped so as to increase the breakdown current generated at the N+ drain to P-Well junction. In the manner, the trigger current can be increased and the trigger voltage of ESD protection device 220 can be correspondingly decreased without changing the area or size of the protection device.

The above detailed descriptions are provided to illustrate specific embodiments of the present invention and are not intended to be limiting. Numerous modifications and variations within the scope of the present invention are possible. For example, the trigger voltage control method of the present invention is implemented by using a shaped periphery in the p-n junction forming the trigger diode. In the above embodiments, the junction periphery is shaped in a corrugated shape or is perforated. Of course, the designs described in the above embodiments and shown in FIGS. 6a and 6b are illustrative only and are not intended to be limiting. The trigger voltage control method of the present invention can be practiced using other shapes or designs for the p-n junction for the purpose of extending the length of the junction periphery. For instance, the junction periphery can be drawn in a serpentine fashion, in an "S" shaped curvature, or perforated with circular openings. Furthermore, the above descriptions illustrate an ESD protection device incorporating an NPN transistor. One of ordinary skill in the art would appreciate that the ESD protection device of the present invention can be constructed using transistors of the opposite polarity. For example, when an PNP transistor is used in the ESD protection device, the polarities of the diffusion regions and wells in the ESD protection device are accordingly reversed, as understood by one of ordinary skill in the art. In addition, in another embodiment, instead of integrating the trigger diode and the main ESD protection device, such as the NPN transistor, in the same layout area of the ESD protection device, the trigger diode can be formed apart from the NPN transistor.

That is, the trigger diode can be formed in a separate layout area on the same substrate as the NPN transistor. When the trigger diode is coupled to the main ESD protection device, such as through the use of metal or other conductive lines, identical ESD protection performance can be achieved. The present invention is defined by the appended claims.

I claim:

1. A semiconductor device formed in a semiconductor substrate for protecting against electrostatic discharge comprising:

a first region of a first conductivity type formed at a top surface of said substrate and having a first dopant concentration, said first region being coupled to an input pad of an integrated circuit;

a first well of a second conductivity type formed in said substrate and positioned adjacent and lateral to said first region;

a second region of said second conductivity type formed in said first well and having a dopant concentration greater than a dopant concentration of said first well;

a third region of said first conductivity type formed in said second region and being connected to a reference voltage, said third region having a dopant concentration greater than said dopant concentration of said second region; and a fourth region of said second conductivity type formed in said second region and being connected to said reference voltage, said fourth region having a dopant concentration greater than said dopant concentration of said second region;

wherein said first region and said first well forms the p-n junction of a trigger diode, and said first region forms a collector region, said first well and said second region form a base and said third region forms an emitter region of an NPN transistor.

2. The semiconductor device of claim 1, wherein said reference voltage comprises a ground voltage.

3. The semiconductor device of claim 1, wherein said first well extends partially under said first region.

4. The semiconductor device of claim 1, wherein said first well extends partially under said second region.

5. The semiconductor device of claim 1, further comprising:

a fifth region of said first conductivity type formed in said first well and said substrate, said fifth region abutting said second region and having a dopant concentration greater than a dopant concentration of said first well;

wherein said fifth region, said second region and said first well form the p-n junction of said trigger diode.

6. The semiconductor device of claim 5, further comprising:

a second well formed in said substrate and of said first conductivity type, said second well abutting said first well.

7. The semiconductor device of claim 6, wherein said first well extends partially under said fifth region.

8. The semiconductor device of claim 6, wherein a junction of said first well and said second well is positioned underneath said second region.

9. The semiconductor device of claim 1, wherein said first conductivity type comprises N-type semiconductor and said second conductivity type comprises P-type semiconductor.

10. The semiconductor device of claim 1, wherein a periphery of said first region abutting said first well comprises a corrugated boundary.

11. The semiconductor device of claim 1, wherein a periphery of said first region abutting said first well comprises a perforated boundary wherein the length of said periphery comprises an outer periphery of said perforated boundary and an inner periphery along perforations in said perforated boundary.

12. The semiconductor device of claim 5, wherein a periphery of said fifth region abutting said first well comprises a corrugated boundary.

13. The semiconductor device of claim 5, wherein a periphery of said fifth region abutting said first well comprises a perforated boundary wherein the length of said periphery comprises an outer periphery of said perforated boundary and an inner periphery along perforations in said perforated boundary.

14. A semiconductor device formed in a semiconductor substrate for protecting against electrostatic discharge comprising:

a first region of a first conductivity type formed in said substrate, said first region having a first dopant concentration;

a second region of said first conductivity type formed in said first region and said substrate, said second region having a dopant concentration greater than said first dopant concentration, said second region being coupled to an input pad of an integrated circuit;

a first well of a second conductivity type formed in said substrate and adjacent said first and second regions;

a third region of said second conductivity type formed in said first well and underneath said first region, said third region having a dopant concentration greater than a dopant concentration of said first well;

a fourth region of said first conductivity type formed in said first well and being connected to a reference voltage, said fourth region having a dopant concentration greater than said dopant concentration of said first well; and a fifth region of said second conductivity type formed in said first well and being connected to said reference voltage, said fifth region having a dopant concentration greater than said dopant concentration of said first well;

wherein said first region and said first well forms the p-n junction of a trigger diode, and said first region forms a collector region, said first well and said third region form a base and said fourth region forms an emitter region of an NPN transistor.

15. The semiconductor device of claim 14, wherein said reference voltage comprises a ground voltage.

16. The semiconductor device of claim 14, wherein said third region is formed as a plurality of elongated regions of said second conductivity type, said plurality of elongated regions being positioned underneath said first region.

17. The semiconductor device of claim 14, wherein said third region is formed as a plurality of slots of said second conductivity type, said plurality of slots being positioned underneath said first region.

18. The semiconductor device of claim 14, wherein said first conductivity type comprises N-type semiconductor and said second conductivity type comprises P-type semiconductor.

* * * * *